US006544860B1

(12) United States Patent
Singh (10) Patent No.: US 6,544,860 B1
(45) Date of Patent: Apr. 8, 2003

(54) SHALLOW TRENCH ISOLATION METHOD FOR FORMING ROUNDED BOTTOM TRENCH CORNERS

(75) Inventor: Kailash N. Singh, San Antonio, TX (US)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 09/519,310

(22) Filed: Mar. 6, 2000

(51) Int. Cl.[7] .................. H01L 21/76; H01L 21/302
(52) U.S. Cl. ................ 438/424; 438/706; 438/711; 438/719; 216/17; 216/39; 216/64; 216/79
(58) Field of Search .................. 438/706–714, 438/424, 723; 428/424, 433, 706, 719, 733; 216/17, 39, 64, 79

(56) References Cited

U.S. PATENT DOCUMENTS

| 4,214,946 A | * | 7/1980 | Forget et al. | 438/712 |
| 5,013,398 A | | 5/1991 | Long et al. | 156/643 |
| 5,705,409 A | * | 1/1998 | Witek | 437/35 |
| 5,920,787 A | | 7/1999 | Haskell et al. | 438/425 |
| 6,008,131 A | * | 12/1999 | Chen | 438/710 |
| 6,191,043 B1 | * | 2/2001 | McReynolds | 438/710 |
| 6,235,214 B1 | * | 5/2001 | Deshmukh et al. | 216/67 |

FOREIGN PATENT DOCUMENTS

| EP | 0272143 A3 | 6/1988 | ......... H01L/21/306 |
| EP | 0272143 A2 | 6/1988 | ......... H01L/21/306 |

OTHER PUBLICATIONS

Patent Abstracts of Japan, vol. 1996, No. 12, Dec. 26, 1996 & JP 08 203875 A (FUJI Electric Co Ltd), Aug. 9, 1996 abstract.

Zhao G., et al: "Silicon Shallow Trench Etch Using HBr/C12/He–02 Chemistry", Proceedings of the International Symposium on Plasma Processing, XX, XX, vol. 96, No. 12 May 5, 1996, pp. 410–415, XP002119407, p. 411, paragraph 2.

* cited by examiner

*Primary Examiner*—Matthew Smith
*Assistant Examiner*—Calvin Lee
(74) *Attorney, Agent, or Firm*—Peter Zawilski (57) ABSTRACT

A method for forming a trench for a shallow trench isolation structure wherein the trench has rounded bottom corners. In one embodiment, the present invention performs a breakthrough etch to remove a native oxide layer disposed over a region of a semiconductor substrate. In so doing, a region of the semiconductor substrate is exposed. Next, the present embodiment etches a trench into the semiconductor substrate using a first etching environment. In this embodiment, the first etching environment is comprised of chlorine, hydrogen bromide, helium, and oxygen. The present embodiment then rounds the bottom corners of the trench using a second etching environment. In this embodiment, the second etching environment is comprised sulfur hexafluoride ($SF_6$) and chlorine. In so doing, the present embodiment provides a method for forming a trench for a shallow trench isolation structure wherein the trench does not have sharp bottom corners formed therein.

36 Claims, 9 Drawing Sheets

SHALLOW TRENCH ISOLATION METHOD FOR FORMING ROUNDED BOTTOM TRENCH CORNERS

TECHNICAL FIELD

The present claimed invention relates to the field of semiconductor devices. More specifically, the present claimed invention relates to semiconductor device isolating structures.

BACKGROUND ART

Shallow groove isolation, sometimes referred to as "shallow trench isolation" (STI), is a semiconductor fabrication technique used in the formation of semiconductor device isolating structures. As an example, STI can be used to form a field oxide region separating two semiconductor devices. More specifically, STI is sometimes used as an alternative to conventional semiconductor device isolating methods such as, for example, local oxidation of silicon (LOCOS).

Figure 1A:
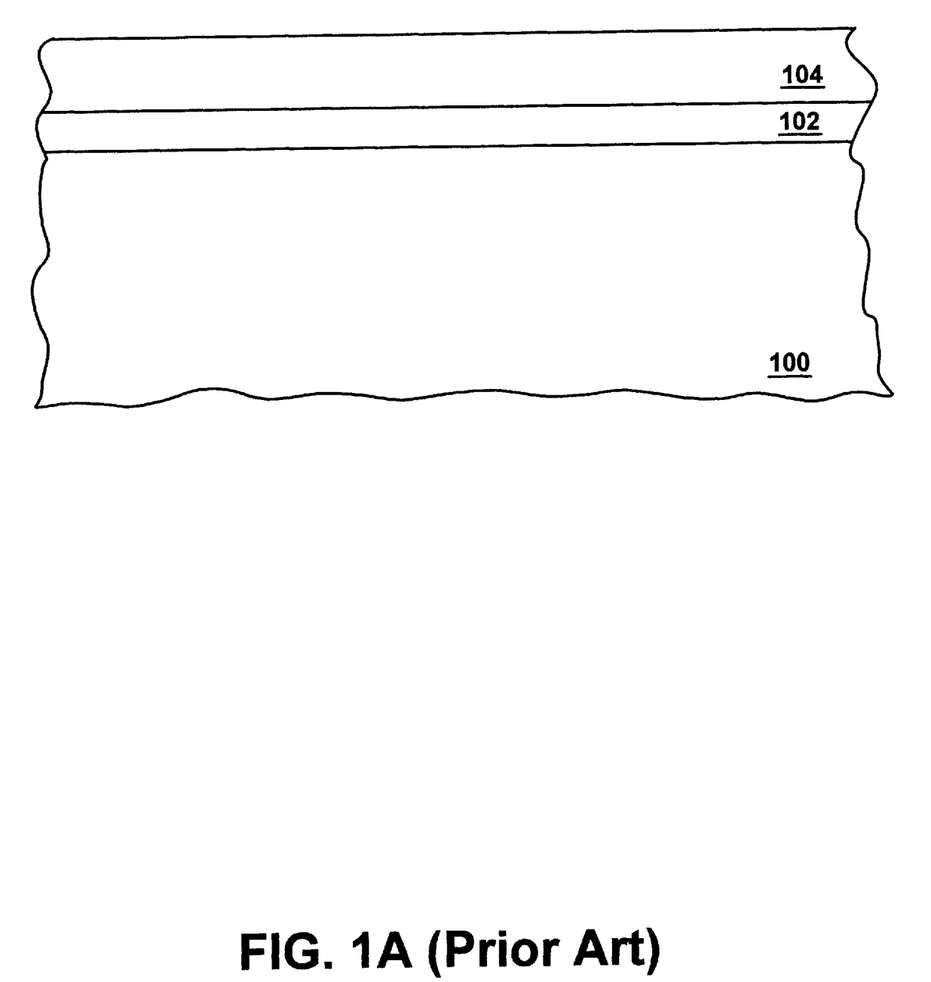
FIG. 1A is a cross-sectional view illustrating steps associated with a prior art STI process.
Figure 1B:
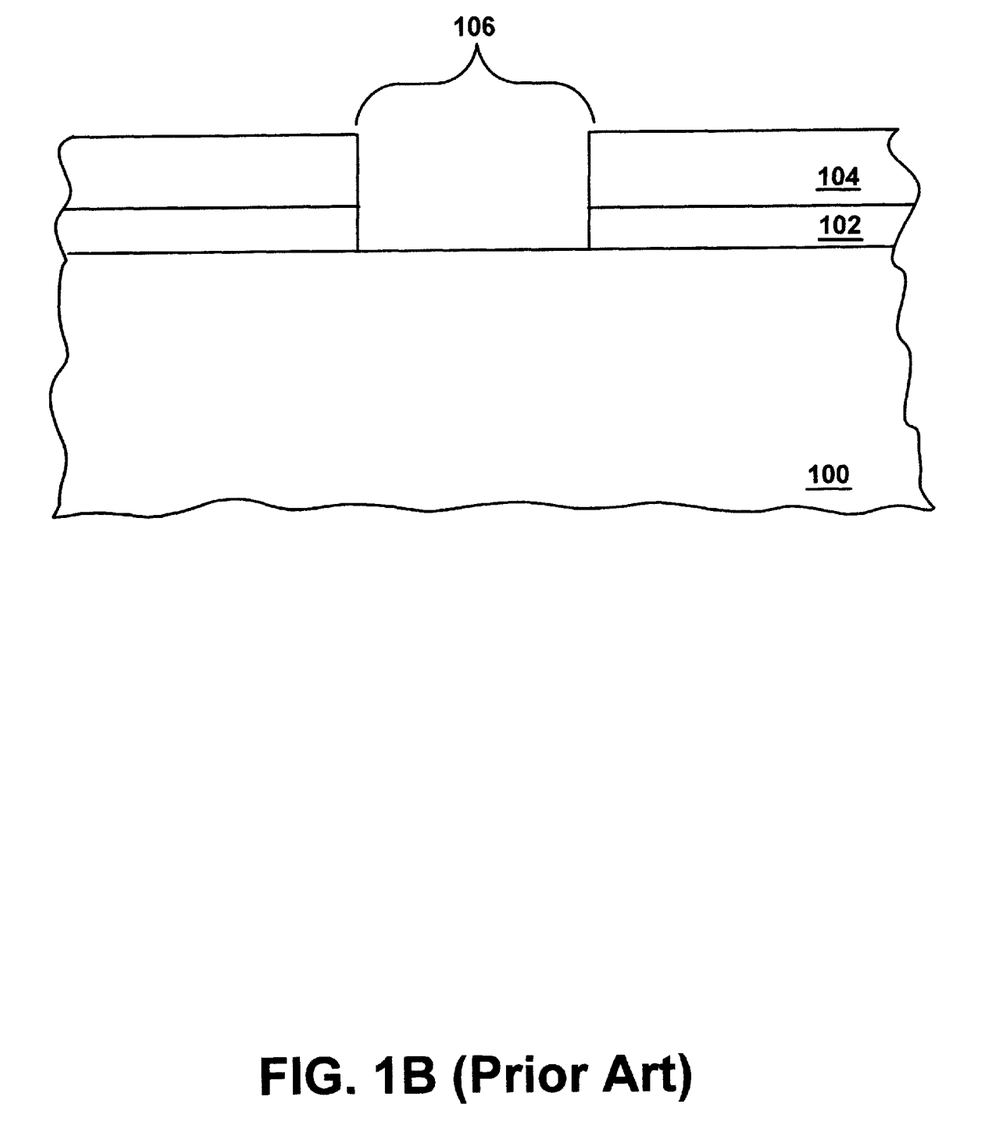
FIG. 1B is a cross-sectional view illustrating steps associated with a prior art STI process.
Figure 1C:
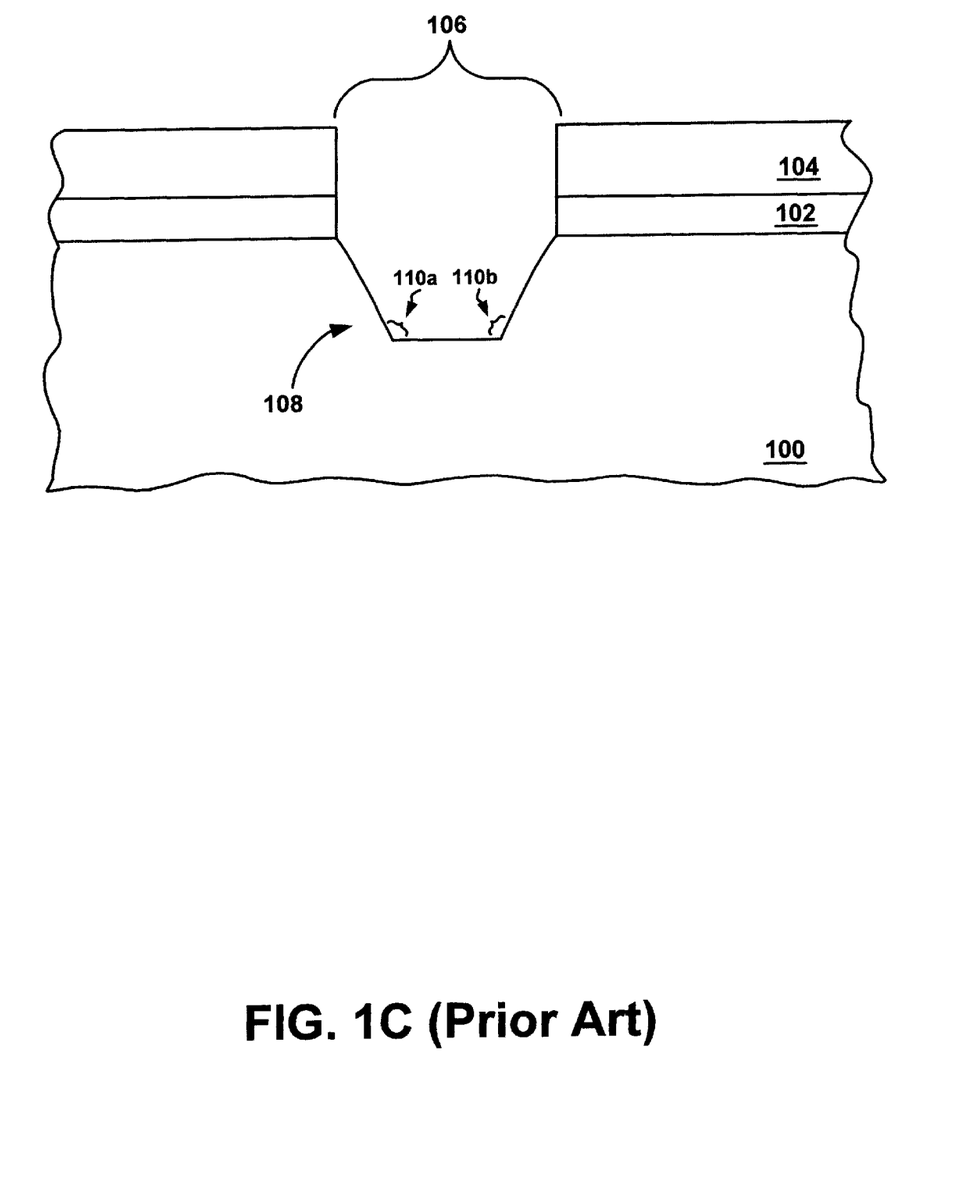
FIG. 1C is a cross-sectional view illustrating steps associated with a prior art STI process.

Referring now to Prior Art FIGS. 1A–1C, side-sectional views illustrating steps used in a prior art STI process are shown. As shown in Prior Art FIG. 1A, a substrate 100 has an oxide 102 and nitride 104 stack formed thereon. The oxide 102 and nitride 104 stack are used to mask underlying semiconductor substrate 100 during subsequent STI process steps.

As shown in Prior Art FIG. 1B, using conventional masking and photolithography steps, a typical STI process forms an opening 106 extending through the oxide 102 and nitride 104 stack. The step is commonly referred to as a exsitu etch and is accomplished using a $CF_4$ and $O_2$ etch chemistry. Opening 106 extends to the top surface of semiconductor substrate 100. This is done outside the trench etch tool.

Referring next to FIG. 1C, this is after resist removal and formation of opening 106. The first step in the STI process is the breakthrough step which is accomplished normally using $CF_4$ etch chemistry. In this etch step, native oxide is removed and the wafer is now ready for the normal trench etch process. In a conventional STI process, a plasma etch or other type of dry etch is then used to etch an opening or "trench" 108 into semiconductor substrate 100. In a conventional STI process, a common etch chemistry comprised of chlorine, hydrogen bromide, helium, and oxygen ($Cl_2$/$HBr$/$He$/$O_2$) is used to etch trench 108 into semiconductor substrate 100. As shown in the cross-sectional view of trench 108 in Prior Art FIG. 1C, a conventional STI process results in the formation of a trench 108 having bottom corners, typically shown as 110a and 110b, which are not rounded. Thus, a trench formed by a conventional STI process does not have a substantially rounded bottom corners.

As is known in the art, prior art trench 108 is typically subsequently filled with dielectric material. However, due to the non-rounded nature of corners 110a and 110b, significant disadvantages are realized. Such sharp corners 110a and 110b reduce semiconductor device isolation effectiveness and device reliability. Specifically, the sharp corners 110a and 110b of prior art trench 108 generate stress during thermal processing. This stress causes dislocations, and may eventually result in reduced leakage protection.

Thus, a need exists for a shallow trench isolation method which produces a trench which does not have sharp bottom corners therein. A further need exists for a shallow trench isolation method which produces a trench having rounded bottom corners.

DISCLOSURE OF THE INVENTION

The present invention provides a shallow trench isolation method which produces a trench which does not have sharp bottom corners therein. The present invention further provides a shallow trench isolation method which produces a trench having rounded bottom corners.

Specifically, in one embodiment, the present invention performs a breakthrough etch to remove a native oxide layer disposed over a region of a semiconductor substrate. In so doing, a region of the semiconductor substrate is exposed. Next, the present embodiment etches a trench into the semiconductor substrate using a first etching environment. In this embodiment, the first etching environment is comprised of chlorine, hydrogen bromide, helium, and oxygen. The present embodiment then rounds the bottom corners of the trench using a second etching environment. In this embodiment, the second etching environment is comprised of sulfur hexafluoride ($SF_6$) and chlorine chemistry. In so doing, the present embodiment provides a method for forming a trench for a shallow trench isolation structure wherein the trench does not have sharp bottom corners formed therein.

In another embodiment of the present invention, the present invention performs a breakthrough etch to remove a native oxide layer disposed over a region of a semiconductor substrate. In so doing, a region of the semiconductor substrate is exposed. Next, the present embodiment etches a trench into the semiconductor substrate using an etching environment. The present embodiment also rounds the bottom corners of the trench using the same etching environment. In this embodiment, the etching environment is comprised of sulfur hexafluoride ($SF_6$) and chlorine chemistry. In so doing, the present embodiment provides a method for forming a trench for a shallow trench isolation structure wherein the trench does not have sharp bottom corners formed therein.

These and other objects and advantages of the present invention will no doubt become obvious to those of ordinary skill in the art after having read the following detailed description of the preferred embodiments which are illustrated in the various drawing figures.

BRIEF DESCRIPTION OF THE DRAWINGS

The accompanying drawings, which are incorporated in and form a part of this specification, illustrate embodiments of the invention and, together with the description, serve to explain the principles of the invention.

Prior Art

Prior Art

Prior Art

It will be understood by those of ordinary skill in the art that other features and elements may be present on the semiconductor substrate but are not shown for the purpose of clarity. Additionally, the drawings referred to in this description should be understood as not being drawn to scale except if specifically noted.

BEST MODE FOR CARRYING OUT THE INVENTION

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be obvious to one of ordinary skill in the art that the present invention may be practiced without these specific details. In other instances, well known methods, procedures, components, and circuits have not been described in detail as not to unnecessarily obscure aspects of the present invention.

Figure 2A:
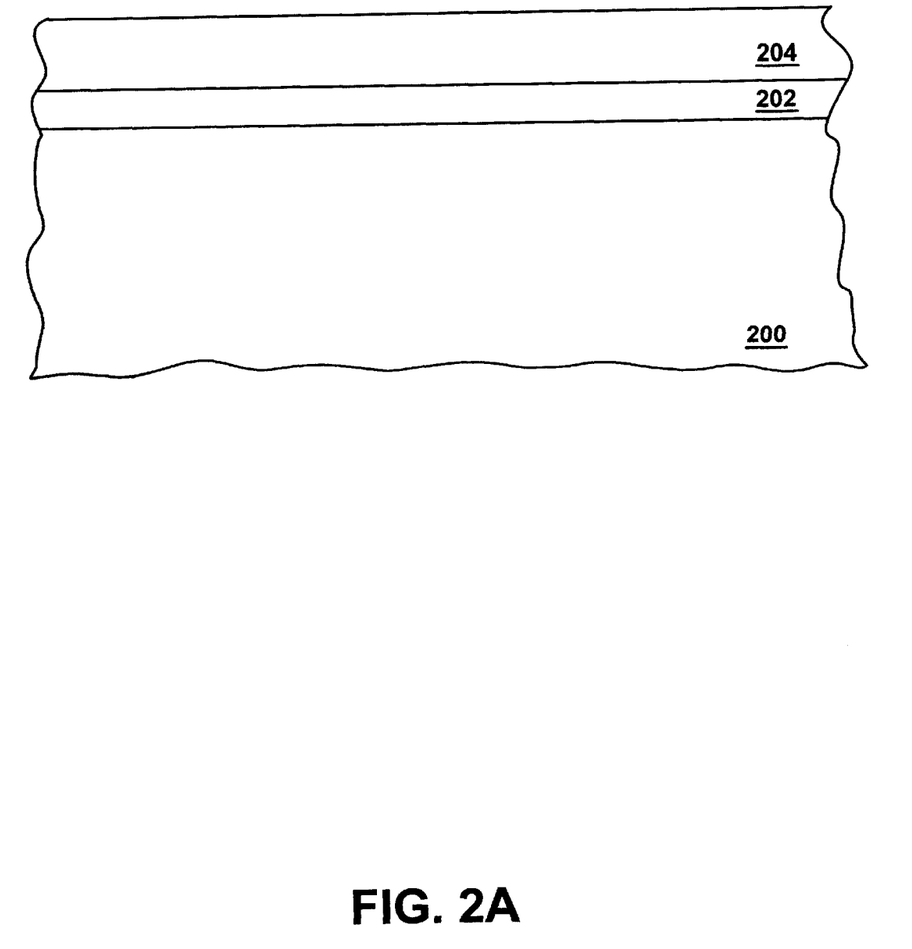
FIG. 2A is a cross-sectional view illustrating steps associated with the formation of a semiconductor device isolating structure in accordance with one embodiment of the present claimed invention.

The following discussion will pertain to cross-sectional views of a semiconductor device isolating structure in various states of fabrication. The following discussion will then pertain to a series of flow charts which describe in detail the processes used to obtain the semiconductor device isolating structure of FIGS. 2A–2C. With reference now to FIG. 2A, a semiconductor substrate 200 such as, for example, silicon, is covered by stack comprised of an oxide layer 202 and a nitride layer 204. Although such a semiconductor substrate and stack is specified in the present embodiment, the present invention is also well suited to various other semiconductor materials, and various other stack layers.

Figure 2B:
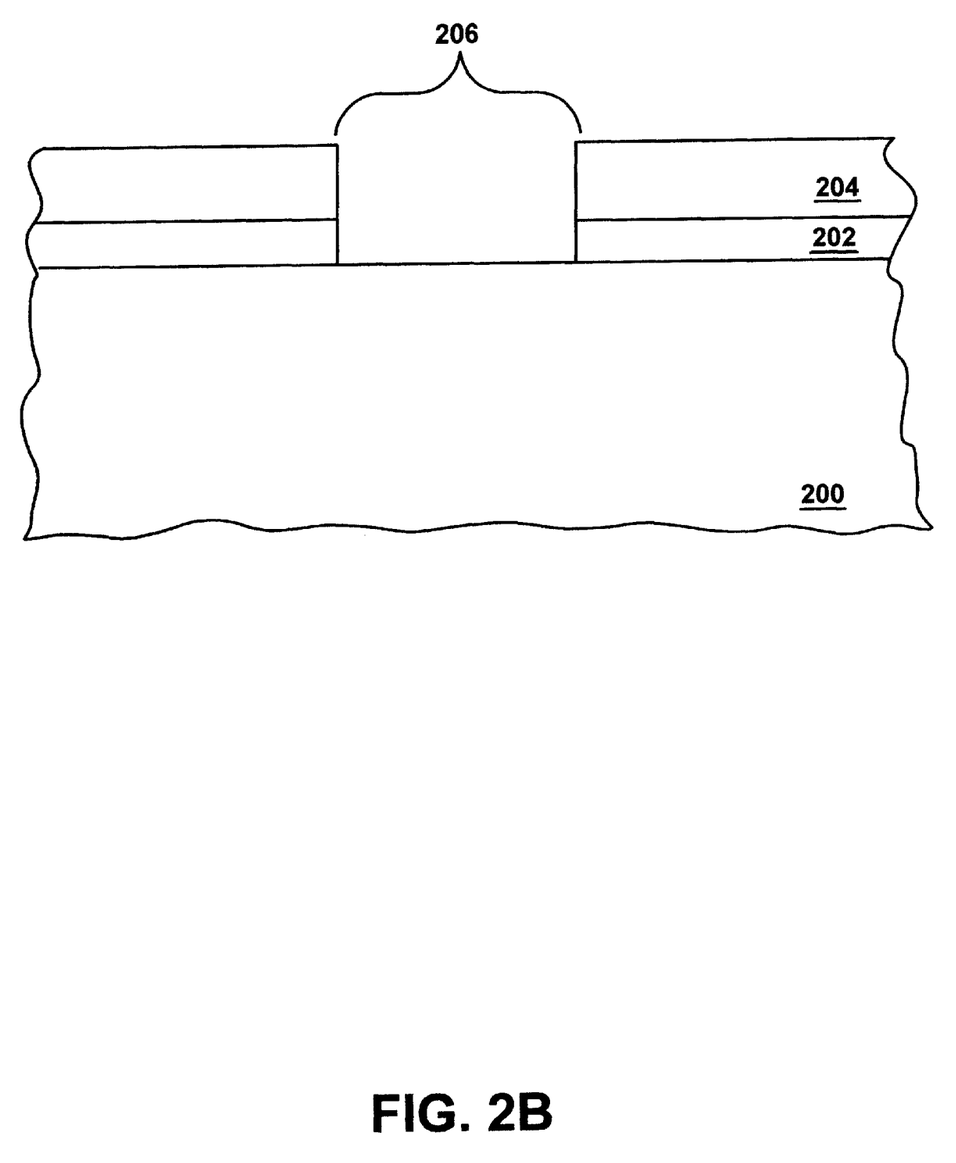
FIG. 2B is a cross-sectional view illustrating a step associated with the formation of a semiconductor device isolating structure in accordance with one embodiment of the present claimed invention.

Referring now to FIG. 2B, the present invention removes a portion 206 of the stack. In so doing, the top surface of semiconductor substrate 200 is exposed.

Figure 2C:
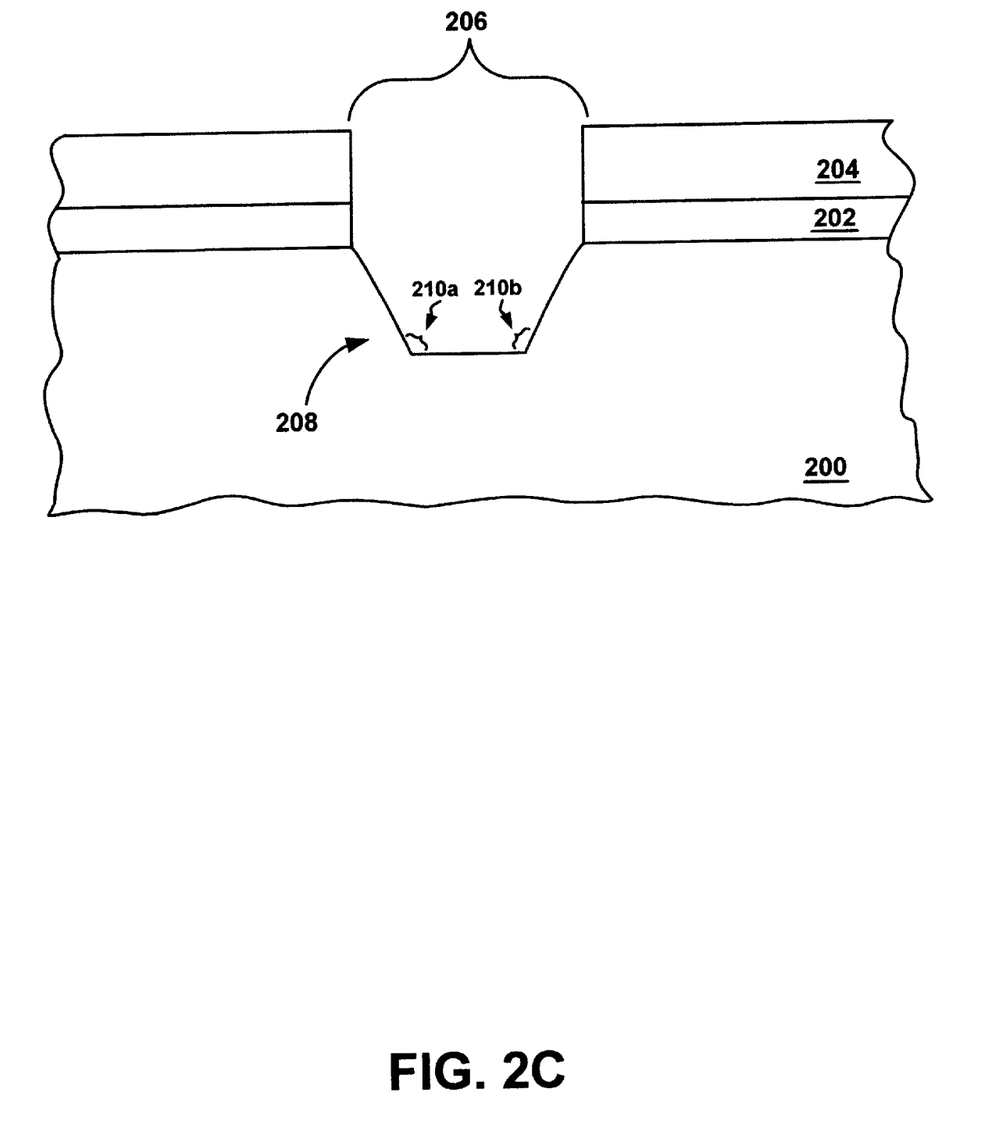
FIG. 2C is a cross-sectional view illustrating a step associated with the formation of a semiconductor device isolating structure in accordance with one embodiment of the present claimed invention.

Referring now to FIG. 2C, the present invention then forms a trench 208 into semiconductor substrate 200. Importantly, in the present invention, trench 208 has rounded bottom corners 210a and 210b formed therein. Referring yet again to FIG. 2C, the cross-sectional view of trench 208 illustrates another substantially advantageous feature of the present invention. Namely, trench 208 has rounded bottom corners 210a and 210b formed therein. In so doing, trench 208 of the present invention drastically reduces stress in the contact between subsequently deposited dielectric material and semiconductor substrate 200 at corners 210a and 210b. Furthermore, smooth rounded bottom corners 210a and 210b further facilitate and enhance coating and bonding of subsequently deposited dielectric material to trench 208.

Referring still to FIG. 2C, smooth rounded corners 210a and 210b of trench 208 improve semiconductor device isolation effectiveness and device reliability over prior art shallow trench isolation structures. Specifically, the sharp corners 110a and 110b of prior art trench 108 generate stress during thermal processing. This stress causes dislocations, and may eventually result in reduced leakage protection. The present invention, however, eliminates such problems by generating smooth rounded corners 210a and 210b in the bottom of trench 208.

Figure 3:
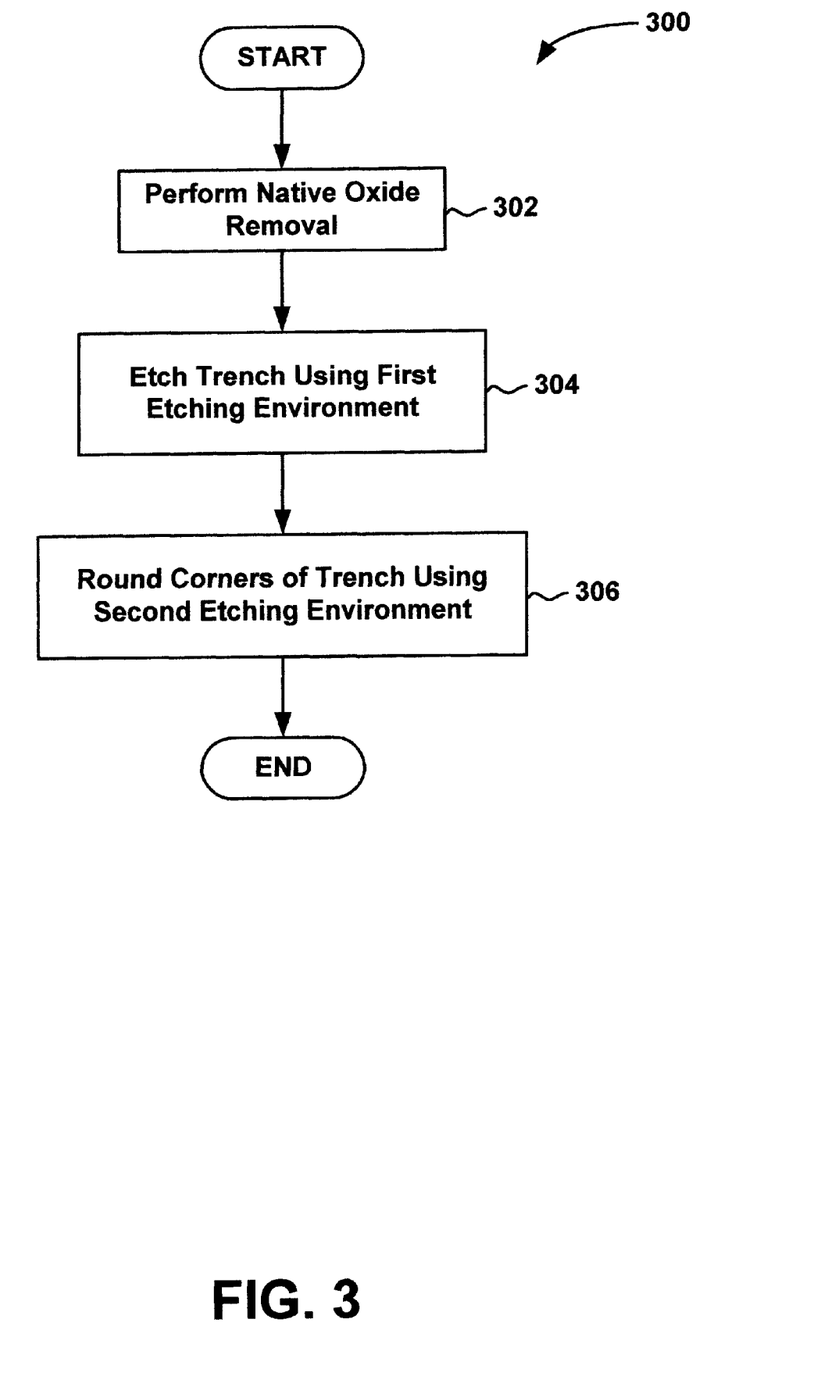
FIG. 3 is a flow chart of steps performed in accordance with one embodiment of the present claimed invention.

With reference next to FIG. 3, a flow chart 300 of steps performed in accordance with one embodiment of the present invention is shown. At step 302, the present embodiment performs a breakthrough etch. The breakthrough etch removes a native silicon oxide layer disposed over a region 206 of semiconductor substrate 200 such that region 206 of semiconductor substrate 200, all of FIG. 2B, is exposed.

Referring still to step 302 of FIG. 3, in the present embodiment, the breakthrough etch is performed using $CF_4$ to remove the native oxide layer disposed over region 206 of semiconductor substrate 200. This is done after the opening 206 is defined in the prior etch. Although such an etchant is used in the breakthrough etch of the present embodiment, the present invention is also well suited to using various other etchants to remove the native oxide.

With reference next to step 304 of FIG. 3, the present embodiment then etches a trench 208 of FIG. 2C into semiconductor substrate 200. In this embodiment, trench 208 is etched into semiconductor substrate 200 using a first etching environment. More specifically, in this embodiment, the first etching environment is comprised of chlorine, hydrogen bromide, helium, and oxygen.

With reference still to step 304, in one embodiment, the present invention introduces chlorine into the first etching environment at a rate of approximately 35 standard cubic centimeters per minute (SCCM); introduces hydrogen bromide into the first etching environment at a rate of approximately 150 standard cubic centimeters per minute (SCCM); introduces helium into the first etching environment at a rate of approximately 8 standard cubic centimeters per minute (SCCM); introduces oxygen into the first etching environment at a rate of approximately 2 standard cubic centimeters per minute (SCCM); and also introduces nitrogen into the first etching environment at a rate of approximately 20 standard cubic centimeters per minute (SCCM). Although such rates are used in the first etching environment of the present embodiment, the present invention is also well suited to using various other rates.

Referring still to step 304 of FIG. 3, the present embodiment introduces operates the first etching environment at a pressure of approximately 30 milliTorr; at a temperature of approximately 60 degrees Celsius; at a power of approximately 250 Watts; and subjects the semiconductor substrate to said the etching environment for a period of approximately 60 seconds. Once again, although such etching environment parameters are used in the first etching environment of the present embodiment, the present invention is also well suited to using various other etching environment parameters.

Referring now to step 306 of FIG. 3, the present embodiment then rounds the bottom corners 210a and 210b of trench 208 to achieve the profile shown in FIG. 2C. In the present embodiment, the present invention uses a second etching environment to form rounded bottom corners 210a and 210b. Hence, the present embodiment ensures that trench 208 does not have sharp bottom corners therein. More specifically, in this embodiment, the second etching environment is comprised of sulfur hexafluoride ($SF_6$) and chlorine mixture.

With reference still to step 306, in one embodiment, the present embodiment introduces sulfur hexafluoride ($SF_6$) into the second etching environment at a rate of approximately 20 standard cubic centimeters per minute (SCCM). Also the present embodiment introduces chlorine into the second etching environment at a rate of approximately 20 standard cubic centimeters per minute (SCCM). Although such rates are used in the second etching environment of the present embodiment, the present invention is also well suited to using various other rates.

Referring still to step 306 of FIG. 3, the present embodiment introduces operates the second etching environment at a pressure of approximately 70 milliTorr; at a temperature of approximately 60 degrees Celsius; at a power of approximately 250 Watts; and subjects the semiconductor substrate to said the etching environment for a period of approximately 20 seconds. Once again, although such etching environment parameters are used in the second etching environment of the present embodiment, the present invention is also well suited to using various other etching environment parameters.

Figure 4:
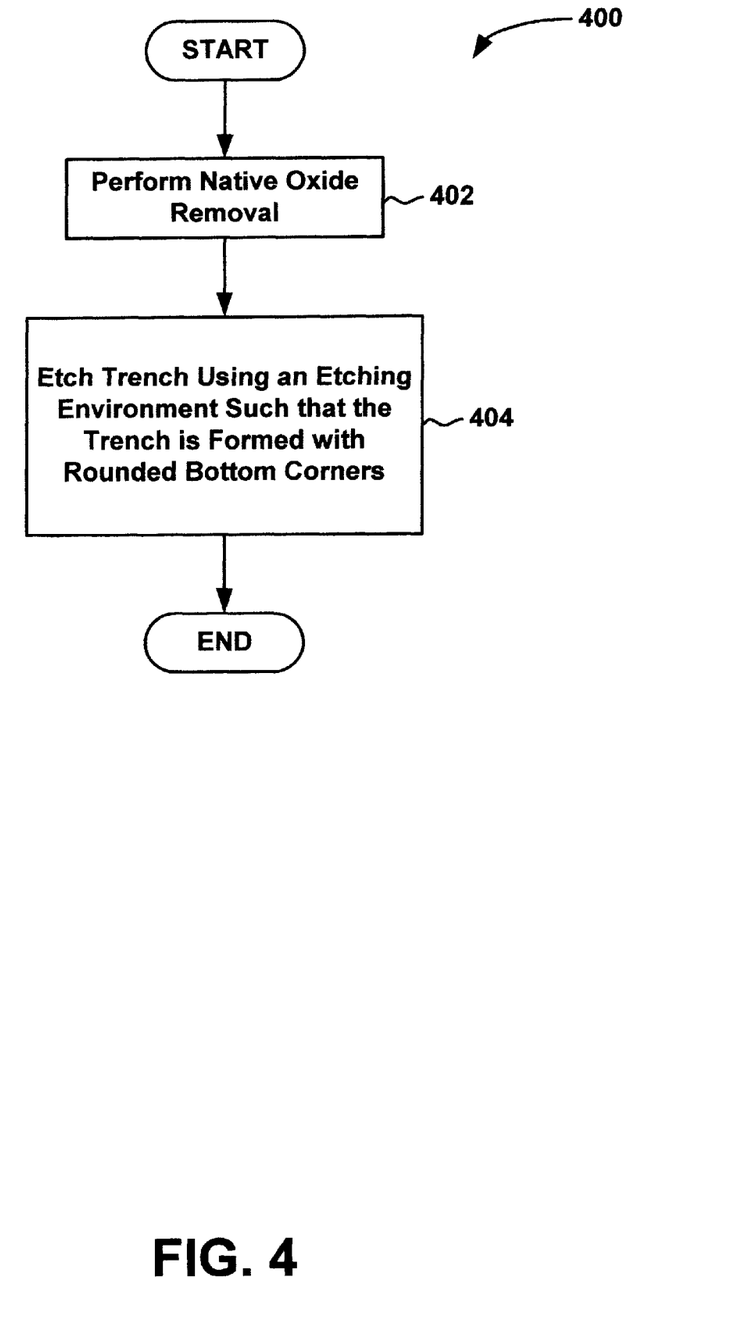
FIG. 4 is a flow chart of steps performed in accordance with one embodiment of the present claimed invention.

With reference next to FIG. 4, a flow chart 400 of steps performed in accordance with one embodiment of the present invention is shown. At step 402, the present embodiment performs a breakthrough etch. The breakthrough etch removes a native silicon oxide layer disposed over a region 206 of semiconductor substrate 200 such that region 206 of semiconductor substrate 200, all of FIG. 2B, is exposed.

Referring still to step 402 of FIG. 4, in the present embodiment, the breakthrough etch is performed using $CF_4$ to remove the native oxide layer in the opening formed at the previous step, disposed over region 206 of semiconductor substrate 200. Although such an etchant is used in the breakthrough etch of the present embodiment, the present invention is also well suited to using various other etchants to remove the native oxide.

With reference next to step 404 of FIG. 4, the present embodiment then etches a trench 208 of FIG. 2C into semiconductor substrate 200. In this embodiment, trench 208 is etched into semiconductor substrate 200 using an etching environment which creates a trench having rounded bottom corners. In so doing, the present embodiment eliminates the deleterious sharp bottom corners associated with the prior art. That is, the present embodiment rounds the bottom corners 210a and 210b of trench 208 to achieve the profile shown in FIG. 2C. Hence, the present embodiment ensures that trench 208 does not have sharp bottom corners therein. More specifically, in this embodiment, the etching environment is comprised of sulfuric fluoride.

With reference still to step 404, in one embodiment, the present embodiment introduces sulfuric fluoride into the second etching environment at a rate of approximately 20 standard cubic centimeters per minute (SCCM). Also the present embodiment introduces chlorine into the second etching environment at a rate of approximately 20 standard cubic centimeters per minute (SCCM). Although such rates are used in the second etching environment of the present embodiment, the present invention is also well suited to using various other rates.

Referring still to step 404 of FIG. 4, the present embodiment introduces operates the second etching environment at a pressure of approximately 70 milliTorr; at a temperature of approximately 60 degrees Celsius; at a power of approximately 250 Watts; and subjects the semiconductor substrate to said the etching environment for a period of approximately 40–60 seconds. Once again, although such etching environment parameters are used in the etching environment of the present embodiment, the present invention is also well suited to using various other etching environment parameters.

Figure 5:
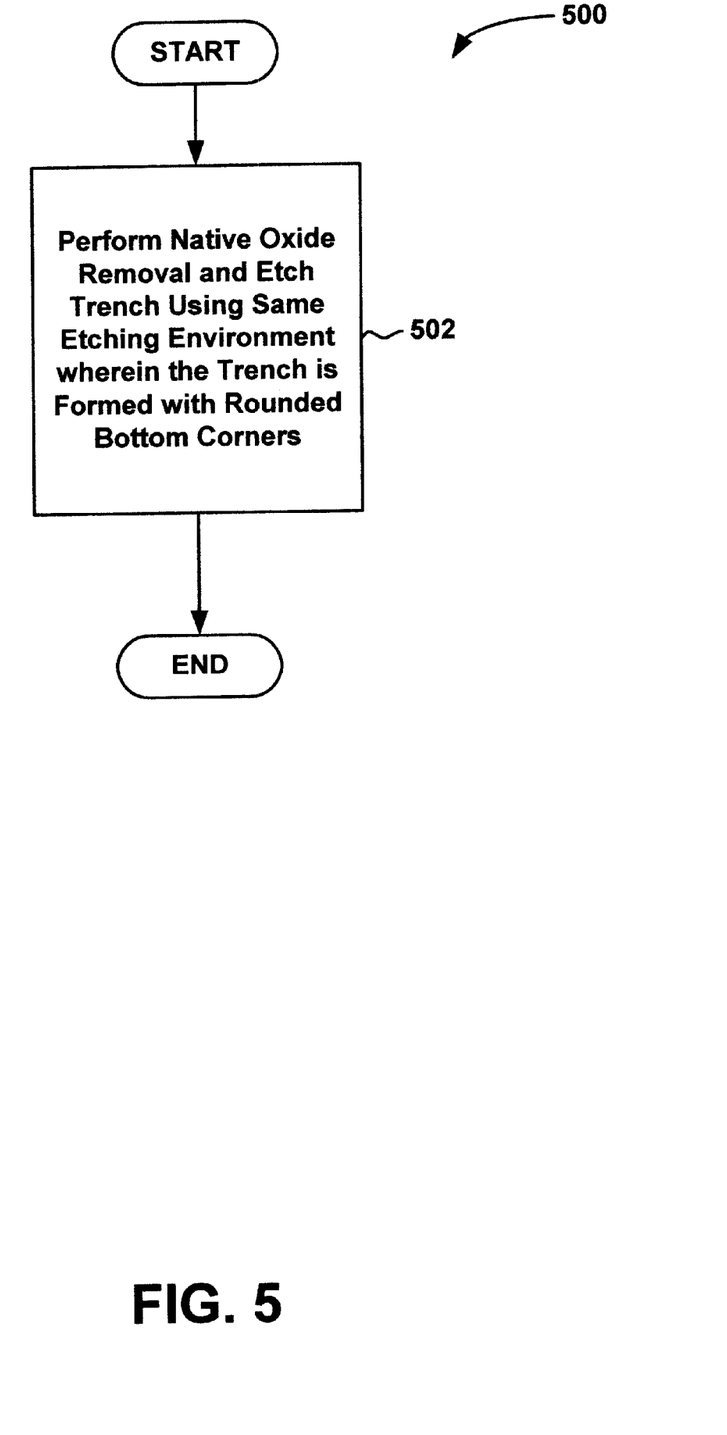
FIG. 5 is a flow chart of steps performed in accordance with one embodiment of the present claimed invention.

With reference next to FIG. 5, a flow chart 500 of steps performed in accordance with one embodiment of the present invention is shown. At step 502, the present embodiment performs a breakthrough etch. The breakthrough etch removes a native oxide layer (e.g. layers 202 and 204) disposed over a region 206 of semiconductor substrate 200 such that region 206 of semiconductor substrate 200, all of FIG. 2B, is exposed.

Referring still to step 502 of FIG. 5, in the present embodiment, the breakthrough etch is performed using sulfuric hexafluoride ($SF_6$) and chlorine to remove the native silicon oxide layer disposed over region 206 of semiconductor substrate 200. Although such an etchant is used in the breakthrough etch of the present embodiment, the present invention is also well suited to using various other etchants to remove the native oxide.

With reference still to step 502 of FIG. 5, the present embodiment then etches a trench 208 of FIG. 2C into semiconductor substrate 200. In this embodiment, trench 208 is etched into semiconductor substrate 200 using the same etching environment which was used to perform the breakthrough etch. Furthermore, this etching environment of the present embodiment forms a trench having rounded bottom corners. In so doing, the present embodiment eliminates the deleterious sharp bottom corners associated with the prior art. That is, the present embodiment rounds the bottom corners 210a and 210b of trench 208 to achieve the profile shown in FIG. 2C. Hence, the present embodiment ensures that trench 208 does not have sharp bottom corners therein. As mentioned above, in this embodiment, the etching environment is comprised of sulfuric fluoride.

With reference still to step 502, in one embodiment, the present embodiment introduces sulfur hexafluoride ($SF_6$) into the etching environment at a rate of approximately 20 standard cubic centimeters per minute (SCCM). Also the present embodiment introduces chlorine into the etching environment at a rate of approximately 20 standard cubic centimeters per minute (SCCM). Although such rates are used in the etching environment of the present embodiment, the present invention is also well suited to using various other rates.

Referring still to step 502 of FIG. 5, the present embodiment introduces operates the etching environment at a pressure of approximately 70 milliTorr; at a temperature of approximately 60 degrees Celsius; at a power of approximately 250 Watts; and subjects the semiconductor substrate to said the etching environment for a period of approximately 40–60 seconds, once region 206 of semiconductor substrate 200 has been exposed by the breakthrough etch. Once again, although such etching environment parameters are used in the etching environment of the present embodiment, the present invention is also well suited to using various other etching environment parameters.

Thus, the present invention provides a shallow trench isolation method which produces a trench which does not have sharp bottom corners therein. The present invention further provides a shallow trench isolation method which produces a trench having rounded bottom corners.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the Claims appended hereto and their equivalents.

What is claimed is:

1. A shallow trench isolation method for forming a trench in a semiconductor substrate comprising:
    a) performing a breakthrough etch to remove a native oxide layer disposed over a region of said semiconductor substrate such that said region of said semiconductor substrate is exposed;
    b) etching a trench into said semiconductor substrate using a first etching environment comprised of chlorine, hydrogen bromide, helium, and oxygen; and
    c) rounding bottom corners of said trench using a second etching environment comprised of sulfur hexafluoride ($SF_6$) and chlorine such that said trench does not have sharp bottom corners therein.

2. The shallow trench isolation method for forming a trench in a semiconductor substrate as recited in claim 1, wherein a) comprises:
    performing said breakthrough etch using $CF_4$ to remove said native oxide layer disposed over said region of said semiconductor substrate such that said region of said semiconductor substrate is exposed.

3. The shallow trench isolation method for forming a trench in a semiconductor substrate as recited in claim 2, wherein b) comprises:
    introducing said chlorine into said first etching environment at a rate of approximately 35 standard cubic centimeters per minute (SCCM).

4. The shallow trench isolation method for forming a trench in a semiconductor substrate as recited in claim 1, wherein b) comprises:
    introducing said chlorine into said first etching environment at a rate of approximately 35 standard cubic centimeters per minute (SCCM).

5. The shallow trench isolation method for forming a trench in a semiconductor substrate as recited in claim 1, wherein b) comprises:
    introducing said hydrogen bromide into said first etching environment at a rate of approximately 150 standard cubic centimeters per minute (SCCM).

6. The shallow trench isolation method for forming a trench in a semiconductor substrate as recited in claim 1, wherein b) comprises:
    introducing said helium into said first etching environment at a rate of approximately 8 standard cubic centimeters per minute (SCCM).

7. The shallow trench isolation method for forming a trench in a semiconductor substrate as recited in claim 1, wherein b) comprises:
    introducing said oxygen into said first etching environment at a rate of approximately 2 standard cubic centimeters per minute (SCCM).

8. The shallow trench isolation method for forming a trench in a semiconductor substrate as recited in claim 1, wherein b) further comprises:
    introducing nitrogen into said first etching environment at a rate of approximately 20 standard cubic centimeters per minute (SCCM).

9. The shallow trench isolation method for forming a trench in a semiconductor substrate as recited in claim 1, wherein b) further comprises:
    operating said first etching environment at a pressure of approximately 30 milliTorr.

10. The shallow trench isolation method for forming a trench in a semiconductor substrate as recited in claim 1, wherein b) further comprises:
    operating said first etching environment at a temperature of approximately 60 degrees Celsius.

11. The shallow trench isolation method for forming a trench in a semiconductor substrate as recited in claim 1, wherein b) further comprises:
    operating said first etching environment at a power of approximately 250 Watts.

12. The shallow trench isolation method for forming a trench in a semiconductor substrate as recited in claim 1, wherein b) further comprises:
    subjecting said semiconductor substrate to said first etching environment for a period of approximately 60 seconds.

13. The shallow trench isolation method for forming a trench in a semiconductor substrate as recited in claim 12, wherein c) comprises:
    introducing said sulfur hexafluoride ($SF_6$) into said second etching environment at a rate of approximately 20 standard cubic centimeters per minute (SCCM).

14. The shallow trench isolation method for forming a trench in a semiconductor substrate as recited in claim 1, wherein c) comprises:
    introducing said sulfur hexafluoride ($SF_6$) into said second etching environment at a rate of approximately 20 standard cubic centimeters per minute (SCCM).

15. The shallow trench isolation method for forming a trench in a semiconductor substrate as recited in claim 1, wherein c) further comprises:
    introducing said chlorine into said second etching environment at a rate of approximately 20 standard cubic centimeters per minute (SCCM).

16. The shallow trench isolation method for forming a trench in a semiconductor substrate as recited in claim 1, wherein c) further comprises:
    operating said second etching environment at a pressure of approximately 70 milliTorr.

17. The shallow trench isolation method for forming a trench in a semiconductor substrate as recited in claim 1, wherein c) further comprises:
    operating said second etching environment at a temperature of approximately 60 degrees Celsius.

18. The shallow trench isolation method for forming a trench in a semiconductor substrate as recited in claim 1, wherein c) further comprises:
    operating said second etching environment at a power of approximately 250 Watts.

19. The shallow trench isolation method for forming a trench in a semiconductor substrate as recited in claim 1, wherein c) further comprises:
    subjecting said semiconductor substrate to said second etching environment for a period of approximately 20 seconds.

20. A shallow trench isolation method for forming a trench in a semiconductor substrate comprising:
    a) performing a breakthrough etch to remove a native oxide layer disposed over a region of said semiconductor substrate such that said region of said semiconductor substrate is exposed;

b) etching a trench into said semiconductor substrate using an etching environment consisting essentially of sulfur hexafluoride ($SF_6$) and chlorine, said trench formed having rounded bottom corners such that said trench does not have sharp bottom corners therein, wherein said breakthrough etch is performed using a different etching environment from that used to etch the trench into said semiconductor substrate.

21. The shallow trench isolation method for forming a trench in a semiconductor substrate as recited in claim 20, wherein a) comprises:

performing said breakthrough etch using $CF_4$ to remove said native oxide layer disposed over said region of said semiconductor substrate such that said region of said semiconductor substrate is exposed.

22. The shallow trench isolation method for forming a trench in a semiconductor substrate as recited in claim 21, wherein b) comprises:

introducing said sulfur hexafluoride ($SF_6$) into said etching environment at a rate of approximately 20 standard cubic centimeters per minute (SCCM).

23. The shallow trench isolation method for forming a trench in a semiconductor substrate as recited in claim 20, wherein b) comprises:

introducing said sulfur hexafluoride ($SF_6$) into said etching environment at a rate of approximately 20 standard cubic centimeters per minute (SCCM).

24. The shallow trench isolation method for forming a trench in a semiconductor substrate as recited in claim 20, wherein b) further comprises:

introducing said chlorine into said etching environment at a rate of approximately 20 standard cubic centimeters per minute (SCCM).

25. The shallow trench isolation method for forming a trench in a semiconductor substrate as recited in claim 20, wherein b) further comprises:

operating said etching environment at a pressure of approximately 70 milliTorr.

26. The shallow trench isolation method for forming a trench in a semiconductor substrate as recited in claim 20, wherein b) further comprises:

operating said etching environment at a temperature of approximately 60 degrees Celsius.

27. The shallow trench isolation method for forming a trench in a semiconductor substrate as recited in claim 20, wherein b) further comprises:

operating said etching environment at a power of approximately 250 Watts.

28. The shallow trench isolation method for forming a trench in a semiconductor substrate as recited in claim 20, wherein b) further comprises:

subjecting said semiconductor substrate to said etching environment for a period of approximately 40–60 seconds.

29. A shallow trench isolation method for forming a trench in a semiconductor substrate comprising:

a) performing a breakthrough etch using $CF_4$ to remove a native oxide layer disposed over a region of said semiconductor substrate such that said region of said semiconductor substrate is exposed;

b) etching a trench into said semiconductor substrate using an etching environment consisting essentially of sulfur hexafluoride ($SF_6$) and chlorine, said trench formed having rounded bottom corners such that said trench does not have sharp bottom corners therein.

30. The shallow trench isolation method for forming a trench in a semiconductor substrate as recited in claim 29, wherein b) comprises:

introducing said sulfur hexafluoride ($SF_6$) into said etching environment at a rate of approximately 20 standard cubic centimeters per minute (SCCM).

31. The shallow trench isolation method for forming a trench in a semiconductor substrate as recited in claim 29, wherein b) comprises:

introducing said sulfur hexafluoride ($SF_6$) into said etching environment at a rate of approximately 20 standard cubic centimeters per minute (SCCM).

32. The shallow trench isolation method for forming a trench in a semiconductor substrate as recited in claim 29, wherein b) further comprises:

introducing said chlorine into said etching environment at a rate of approximately 20 standard cubic centimeters per minute (SCCM).

33. The shallow trench isolation method for forming a trench in a semiconductor substrate as recited in claim 29, wherein b) further comprises:

operating said etching environment at a pressure of approximately 70 milliTorr.

34. The shallow trench isolation method for forming a trench in a semiconductor substrate as recited in claim 29, wherein b) further comprises:

operating said etching environment at a temperature of approximately 60 degrees Celsius.

35. The shallow trench isolation method for forming a trench in a semiconductor substrate as recited in claim 29, wherein b) further comprises:

operating said etching environment at a power of approximately 250 Watts.

36. The shallow trench isolation method for forming a trench in a semiconductor substrate as recited in claim 29, wherein b) further comprises:

subjecting said semiconductor substrate to said etching environment for a period of approximately 40–60 seconds.

* * * * *